United States Patent
Muhr et al.

(10) Patent No.: US 7,842,171 B2
(45) Date of Patent: Nov. 30, 2010

(54) TESTING ARRANGEMENT FOR MEASURING DIELECTRIC STRENGTH OF LIQUID INSULATING MEDIA

(75) Inventors: Michael Muhr, Graz (AT); Werner Lick, Graz (AT); Georg Johannes Pukel, St. Michael (AT)

(73) Assignee: Baur Pruef-und Messtechnik GmbH, Sulz (AT)

(*) Notice: Subject to any disclaimer, the term of this patent is extended or adjusted under 35 U.S.C. 154(b) by 883 days.

(21) Appl. No.: 11/693,353

(22) Filed: Mar. 29, 2007

(65) Prior Publication Data

US 2007/0227880 A1    Oct. 4, 2007

(30) Foreign Application Priority Data

Mar. 30, 2006    (AT) .............................. A 554/2006

(51) Int. Cl.
*G01N 27/403*    (2006.01)
*G01N 27/02*    (2006.01)

(52) U.S. Cl. ................. 204/242; 73/864.91; 422/82.01; 324/439

(58) Field of Classification Search ................ 204/242; 324/553, 557, 726, 439, 444; 73/52, 64.56, 73/74, 864.51, 864.91, 866; 422/82.01, 82.02
See application file for complete search history.

(56) References Cited

U.S. PATENT DOCUMENTS 2,663,819 A * 12/1953 Goddard .................... 313/261
3,996,512 A * 12/1976 Baur .......................... 324/533

FOREIGN PATENT DOCUMENTS

| AT | 376 808 | 1/1985 |
|----|---------|--------|
| DE | 25 16 991 | 10/1975 |
| DE | 75 12 309 | 3/1979 |
| DE | 33 00 468 | 7/1984 |
| JP | 58-201077 | 11/1983 |
| JP | 2000-193641 | 7/2000 |
| JP | 2006-087260 | 3/2006 |

OTHER PUBLICATIONS

Heydon, R. G., "A Versatile Three-terminal Test Cell for Dielectric Measurements on Insulating Liquids", IEEE Transactions on Electrical Insulation, vol. 24, No. 4, Aug. 1989, p. 649-655.*
Leaflets showing devices of the Assignee for measuring dielectric strength.

* cited by examiner

*Primary Examiner*—Nam X Nguyen
*Assistant Examiner*—J. Christopher Ball
(74) *Attorney, Agent, or Firm*—Frommer Lawrence & Haug LLP

(57) ABSTRACT

A testing arrangement for testing the dielectric strength of liquid insulating media has a test cell comprising an interior space for receiving the insulating medium to be tested and a first test electrode and a second test electrode for generating an electric field in a test volume of the test cell. The test cell is arranged in the interior of a receiving vessel which is filled with an auxiliary insulating medium or in the interior of an evacuated receiving vessel.

20 Claims, 3 Drawing Sheets

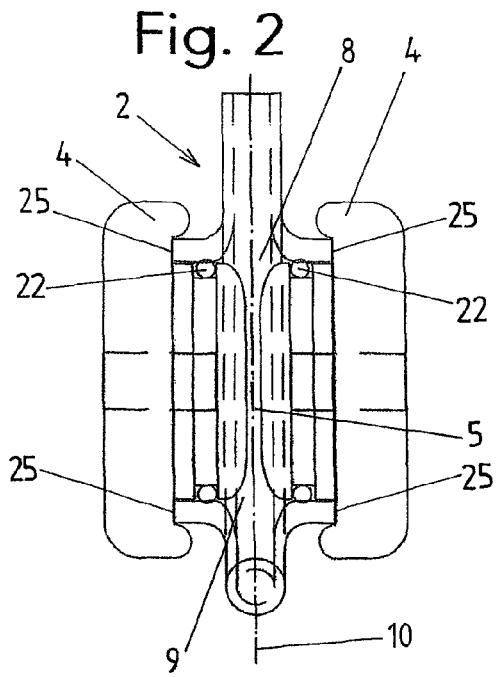
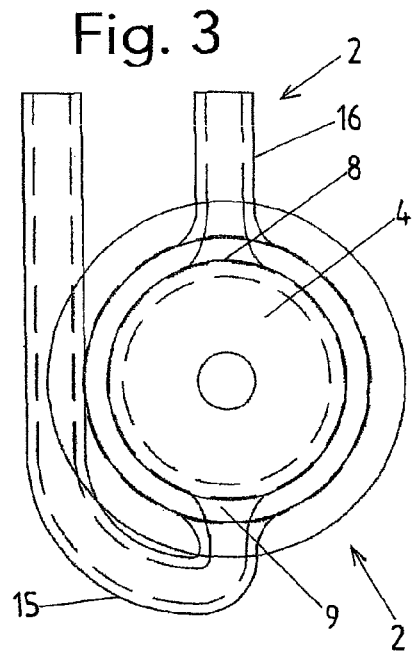
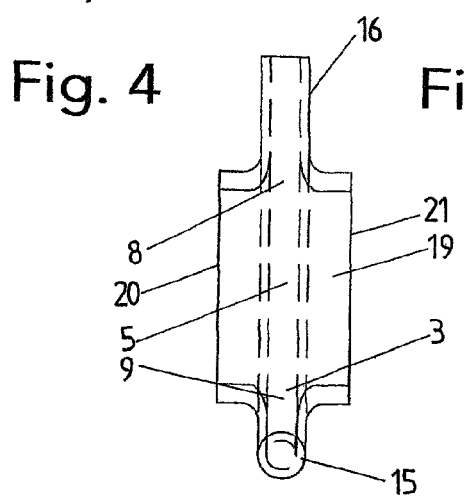
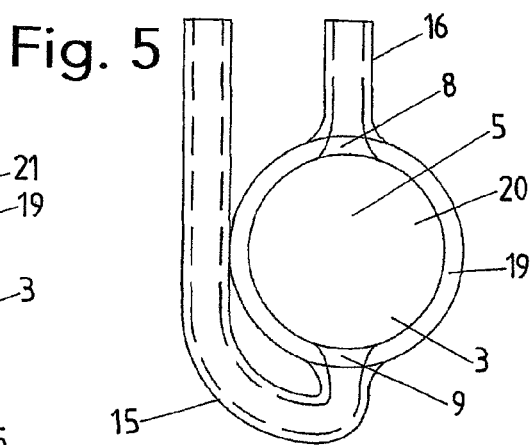
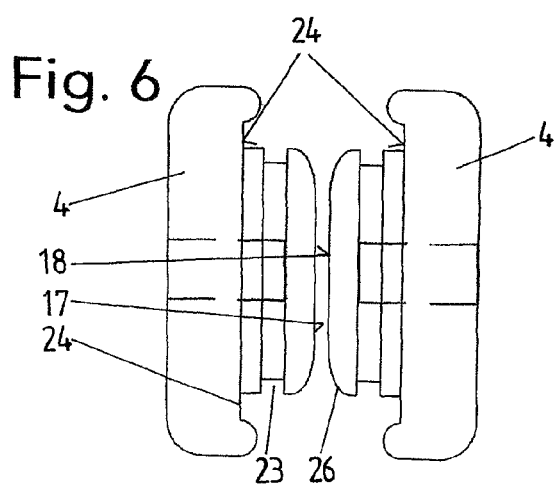
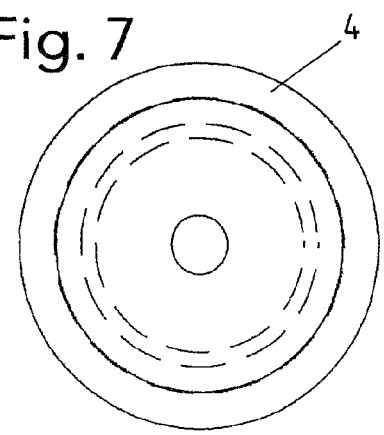

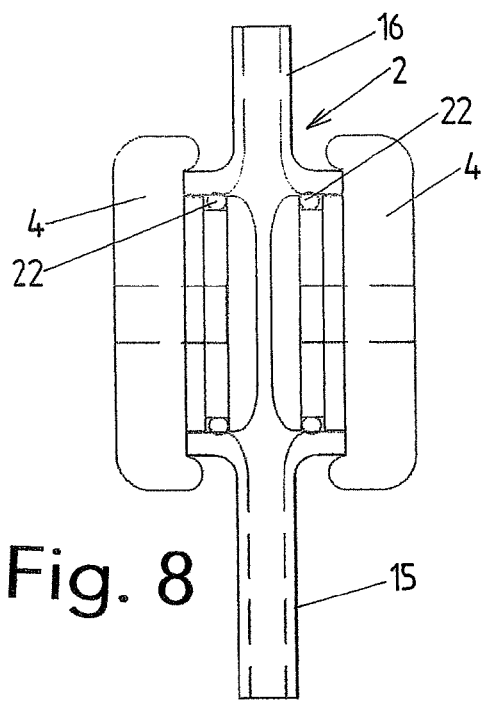
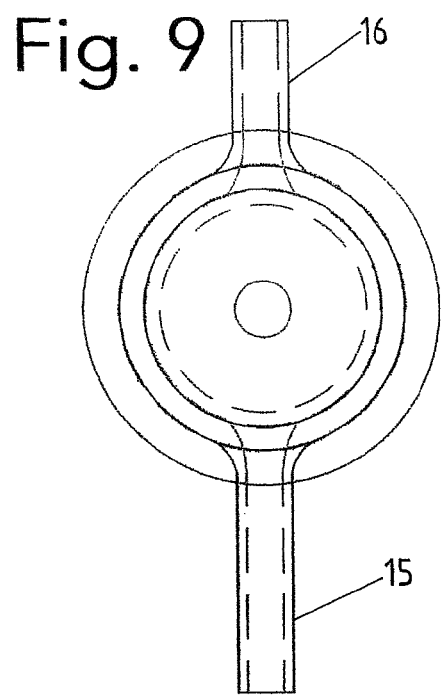
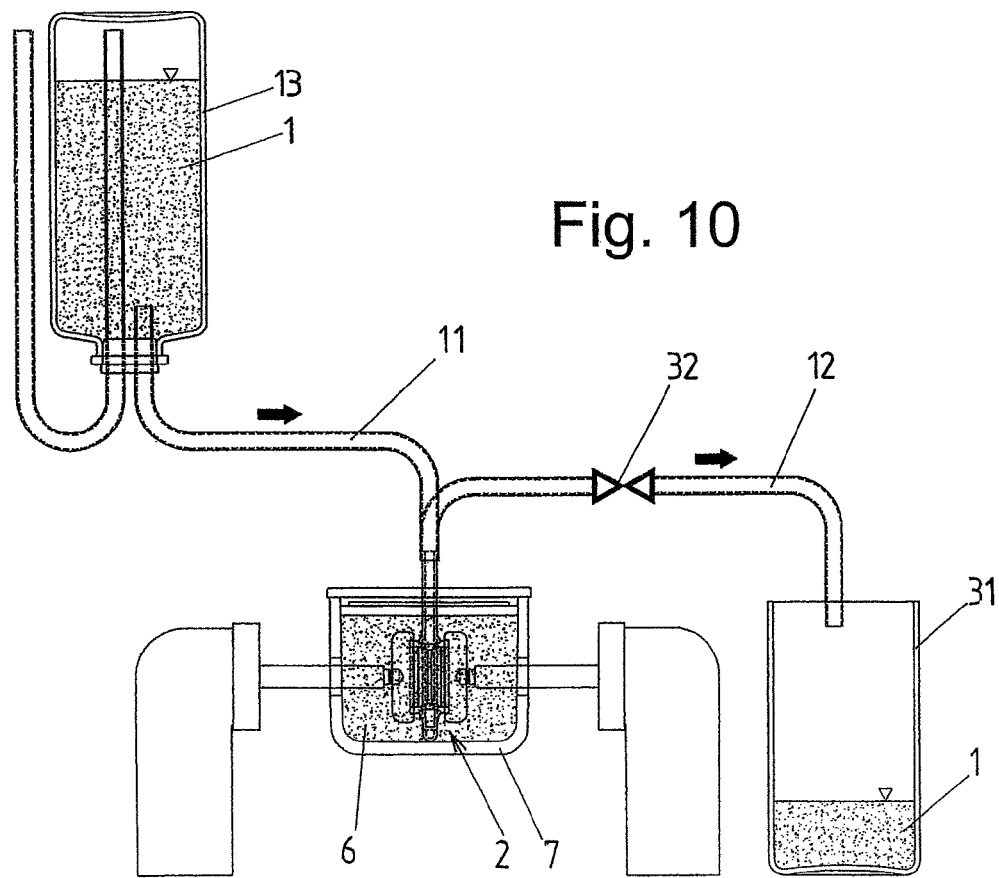

TESTING ARRANGEMENT FOR MEASURING DIELECTRIC STRENGTH OF LIQUID INSULATING MEDIA

CROSS-REFERENCE TO RELATED APPLICATION

This application claims priority of Austrian Application No. A 554/2006, filed Mar. 30, 2006, the complete disclosure of which is hereby incorporated by reference.

BACKGROUND OF THE INVENTION a) Field of the Invention

The invention is directed to a testing arrangement for testing the dielectric strength of liquid insulating media which has a test cell comprising an interior space for receiving the insulating medium to be tested and a first test electrode and a second test electrode for generating an electric field in a test volume of the test cell.

b) Description of the Related Art

A testing arrangement for testing dielectric strength of liquid insulating media of the type mentioned above is known, for example, from DE 25 16 991 A1. Also, there are standards dealing with the testing of the dielectric strength of liquid insulating media by means of testing arrangements of the type mentioned above; IEC 60156 or ASTM D 1816 are cited as examples. The testing arrangement or testing arrangements known from DE 25 16991 A1 which correspond to the above-cited relevant standards require a large sample amount of insulating medium for testing. However, the costs for disposal of this insulating medium are high due to its toxicity. Also, a test can only be carried out when such a large sample amount is available at all. When this is not the case, for example, in high-voltage switches containing insulating oil, a measurement of the dielectric strength cannot be taken. Another disadvantage is that the actual test volume of known testing arrangements is small in proportion to the interiors of the test cells, which has a negative impact on the reproducibility of the measurements. As a result of the large interior spaces of the test cells which are filled with the insulating medium to be tested, solids from the insulating medium to be tested deposit in the test cell in spite of active homogenization, e.g., agitation, which leads to increased expenditure on cleaning and ultimately falsifies the measurement results. The breakdown voltages that are determined with the known testing arrangements exhibit stochastically distributed measurement errors with undesirably large scattering for a given insulating medium to be tested, even in the same testing arrangement.

OBJECT AND SUMMARY OF THE INVENTION

It is the primary object of the invention to provide a testing arrangement for determining the dielectric strength of liquid insulating media which makes do with a small sample amount of the insulating medium to be tested and, at the same time, provides a comparatively large test volume.

According to the invention, this object is met by a testing arrangement for testing the dielectric strength of liquid insulating media having a test cell comprising an interior space for receiving the insulating medium to be tested and a first test electrode and a second test electrode for generating an electric field in a test volume of the test cell, and the test cell is arranged in the interior of a receiving vessel which is filled with an auxiliary insulating medium or in the interior of an evacuated receiving vessel.

According to the invention, the test cell is arranged in the interior of a receiving vessel that is filled with an auxiliary insulating medium. Instead of filling the interior of the receiving vessel with an auxiliary insulating medium, the receiving vessel could also be evacuated.

Electric discharges, e.g., gliding discharges or even breakdowns, outside of the test volume can be simply and effectively prevented by the arrangement according to the invention, in spite of the fact that the test cell has a small internal volume while, at the same time, providing a relatively large test volume.

In an advantageous manner, a test cup of a conventional, standardized testing arrangement can be used as a receiving vessel. Accordingly, conventional standardized testing arrangements could be retrofitted in a simple manner in such a way that they are constructed according to the invention.

In an advantageous embodiment form of the invention, two oppositely located side walls of the test cell are formed at least for the most part, preferably in their entirety, by the first test electrode and the second test electrode.

In a preferred embodiment form of the invention, the test cell has a test cell base body which is substantially constructed as a preferably cylindrical pipe piece with an inlet pipe connection piece and an outlet pipe connection piece for the insulating medium to be tested. The test electrodes project through two receiving openings of the test cell base body toward the test volume of the test cell, which receiving openings are formed by the open ends of the pipe piece forming the test cell base body. A sealing ring is arranged for sealing between the receiving openings of the test cell base body and the test electrodes projecting through these receiving openings.

The test electrodes preferably have Rogowski profiles which are designed, for example, for an electrode gap of 2 mm.

Further advantages and details of the invention are described in the following with reference to the accompanying drawings which also present further objects of the invention.

BRIEF DESCRIPTION OF THE DRAWINGS

In the drawings:

FIG. 2 shows a side view of the embodiment form of the test cell from FIG. 1;

FIG. 3 shows a front view of the test cell from FIG. 2;

FIG. 4 shows a side view of the test cell base body from FIGS. 1 to 3;

FIG. 5 shows a front view of the test cell base body from FIG. 4;

FIG. 6 shows a side view of the first test electrode and second test electrode with the test cell base body removed;

FIG. 7 shows a front view of the first test electrode and second test electrode from FIG. 6;

FIG. 8 shows a side view of a second embodiment form of a test cell with a straight inlet pipe connection piece and outlet pipe connection piece, including test electrodes;

FIG. 9 shows a front view of the test cell from FIG. 8; and

FIG. 10 shows another embodiment example of a testing arrangement according to the invention.

Figure 1:
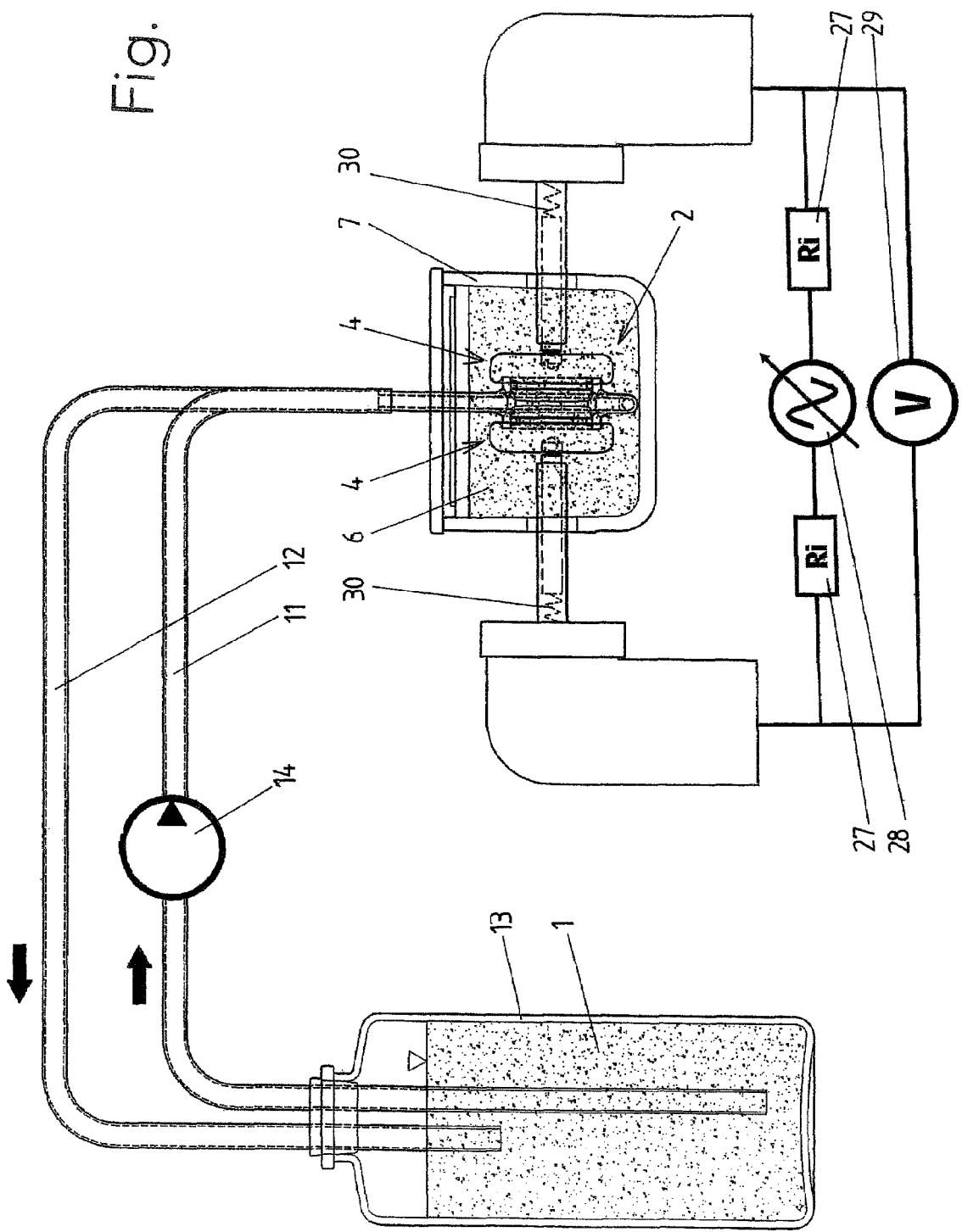
FIG. 1 shows a schematic view of a first embodiment example of a testing arrangement according to the invention with a first embodiment form of the test cell with a curved outlet pipe connection piece.

Different scales are used in the drawings.

DESCRIPTION OF THE PREFERRED EMBODIMENT EXAMPLES

FIGS. 1 to 7 show a testing arrangement for determining the dielectric strength of liquid insulating media according to a first embodiment form.

The testing arrangement comprises a receiving vessel 7 which is filled with an auxiliary insulating medium 6 and a test cell 2 (see FIG. 1) which is arranged in this receiving vessel 7. The auxiliary insulating medium 6 in the receiving vessel 7 prevents a strong electric field generated in the interior of the test cell 2 from generating gliding discharges outside a test volume 5 located in the interior of the test cell 2. Gliding discharges of this kind would corrupt the measurement results and must be prevented for this reason. As is also shown in FIG. 1, the receiving vessel 7 can take the form of a test cup, for example, which corresponds to the standards cited above and which is formed as a bowl that is closed by a cover. In an advantageous manner, a liquid auxiliary insulating medium 6, e.g., an oil withstanding high voltages, preferably fresh oil, is used. A gaseous auxiliary insulating medium 6, e.g., sulfur hexafluoride (SF6), could also be used. In the latter case, however, the receiving vessel 7 would have to be tightly sealed on all sides. This would also be the case if, instead of its interior being filled with an auxiliary insulating medium 6, the receiving vessel 7 were evacuated in order to prevent gliding discharges, which represents another possible embodiment form.

The test cell 2 which is arranged in the interior of the receiving vessel 7 has an interior space 3 for receiving the insulating medium 1 to be tested. The separation of the interior space 3 of the test cell 2 from the auxiliary insulating medium 6 prevents the insulating medium 1 to be tested from mixing with the auxiliary insulating medium 6.

The test cell 2 comprises a first test electrode 4 and second test electrode 4 for generating an electric field in the test volume 5 of the test cell 2. This test volume 5 occupies the largest possible portion of the interior space 3 of the test cell 2. The electric field generated by the test electrodes 4 fills the test volume 5 and is used for testing the dielectric strength of the insulating medium 1 to be tested.

The test cell 2 has an inlet opening 8 for the insulating medium 1 to be tested to flow in and an outlet opening 9 for the insulating medium 1 to be tested to flow out so that the insulating medium 1 to be tested can be put into and removed again from the interior space 3.

The inlet opening 8 and the outlet opening 9 are advantageously arranged opposite to one another with respect to the test volume 5. They lie in the area of a center plane 10 between the first electrode 4 and second electrode 4. It is preferable (see FIG. 1) when the inlet opening 8 is arranged at the top of the test cell 2 and the outlet opening 9 is arranged at the bottom of the test cell 2 with respect to the direction of gravitational force. This allows a particularly homogeneous flow of the insulating medium 1 to be tested.

The first electrode and second electrode are preferably arranged in a mirror-symmetric manner with respect to the center plane 10.

In the embodiment example according to FIG. 1, the inlet opening 8 and outlet opening 9 are connected to a sample vessel 13 for the insulating medium 1 to be tested by an inlet line 11 and an outlet line 12, respectively. The insulating medium 1 to be tested can be made to circulate between the sample vessel 13 and the test cell 2 by means of a pump 14. In this way, the flow can be adjusted to a preferred quantity. The pump 14 can be a hose pump, for example. An insulating medium 1 flowing in the test volume 5 during the test more accurately represents the true conditions in a high-voltage transformer or a high-voltage switch than a stationary insulating medium 1 because a certain convection of the cooling medium and/or insulating medium always occurs in the cooling medium vessel and insulating medium vessel of an electromagnetic energy converter depending on the inevitable heat development. Moreover, an insulating medium 1 flowing homogeneously in particular through the test volume 5 results in improved reproducibility of measurements.

It is also conceivable to maintain the flow in the test cell 2 without circulation merely by means of a hydrostatic pressure difference as will be discussed in more detail in the following.

An inlet pipe connection piece 15 and outlet pipe connection piece 16 proceeding from the test cell 2 adjoin the inlet opening 8 and outlet opening 9, respectively, at least one of which inlet pipe connection piece 15 and outlet pipe connection piece 16 is curved or bent. The inlet pipe connection piece 15 and outlet pipe connection piece 16 project out through the same opening of the receiving vessel 7. For example, a straight inlet pipe connection piece 15 and a curved outlet pipe connection piece 16 can be provided as is shown in FIGS. 1 to 5. This construction is particularly advantageous when the receiving vessel 7 has only one opening, particularly when it takes the form of a standardized test cup with an individual opening that is closed by a cover. The pipe connection pieces 15, 16 are guided through bore holes in the cover. This construction is also advantageous when only small sample amounts of insulating medium 1 are available. The reproducibility of measurements can be improved in small amounts of sample by a flow of the insulating medium 1 maintained by a pump 15 in a closed circuit. The inlet pipe connection piece 15 and outlet pipe connection piece 16 are advantageously constructed integral with a test cell base body 19 of the test cell 2.

The test cell base body 19 of the test cell 2 has oppositely located receiving openings 20, 21 for the passage of a test electrode 4. The receiving openings extend along the entire respective side of the test cell base body 19, and the test electrodes form oppositely located side walls of the test cell base body 19 which define the interior space 3 of the test cell 2.

The test cell base body 19 comprises a highly electrically insulating material. Mineral glass is very well suited because it allows visual inspection on one hand and has a particularly high insulating resistance on the other hand. The test cell base body 19 could also be made from acrylic, for example, which is advantageous because this material is easy to process. However, acrylic glass is less preferable in view of its instability with respect to the cleaning agent (acetone) prescribed in the relevant standards.

The test cell base body 19 takes the form of a preferably cylindrical pipe piece. The receiving openings 20, 21 are formed by the open ends of the pipe piece. The test electrodes 4 received by them have a neck portion which corresponds to the contour of the pipe piece, that is, is preferably cylindrical, and which is provided at its circumference with an annular groove 23 in which a sealing ring 22 is arranged for sealing between the test cell base body 19 and the test electrodes 4. More than one sealing ring per test electrode could also be used.

The cross section of the annular groove is advantageously adapted to the cross section of the sealing ring in order to prevent air inclusion and particle deposits in the sealing area as far as possible. The sealing rings 22 can be constructed, for example, as O-rings.

The test electrodes 4 have stops 24 which contact counter-stops 25 of the test cell base body 19 for fixing the electrode gap (see FIGS. 2 and 8; FIG. 6 shows the stops 24 in detail). In a construction of this kind, conventional outfitting of the testing arrangement with a vernier for precise adjustment of the electrode gap, which is laborious and expensive, is no longer needed. The field strength and field strength curve of the electric field in the test volume 5 that are relevant for the test and the breakdown voltages depend, as is well known, not only on the electric voltage applied to the test electrodes 4 but also on the electrode gap which for this reason must be precisely adjusted to the desired value for correct testing.

The stops 24 can be prevented from lifting off from the counter-stops 25 by means of springing-elastic members 30 which press the stops 24 of the test electrodes 4 against the counter-stops 25 of the test cell base body 19 as is shown schematically in FIG. 1.

The stops 24 are arranged at an enlarged head portion of the test electrodes 4 which lies opposite the neck portion outside the test cell base body 19.

When a substantially homogeneous electric field can be formed by the test electrodes 4 in the test volume 5, an electric load of equal magnitude is applied to all of the partial volumes of the test volume 5 which is filled with the insulating medium 1 to be tested. This is very advantageous for the representativeness of the test results and their reproducibility. When the electrode profile of the first test electrode 4 and second test electrode 4 is formed as a Rogowski profile 26 (shown only roughly in the drawing as an ellipse), an almost homogeneous electric field can be generated in the test volume 5. A comparatively large test volume 5 can be acted upon in the test cell 2 by a homogeneous electric field by forming Rogowski profiles 26 at the test electrodes 4.

The electrode surfaces which are wetted by the insulating medium and form the electric field in the test volume and which preferably have a Rogowski profile are arranged, respectively, in the front side of the neck portion of the test electrode 4 remote of the head portion.

It is advantageous when using a standardized test cup as receiving vessel 7 that the first test electrode 4 and second test electrode 4, respectively, have a diameter less than or equal to 40 mm. In particular, the electrode gap can be between 1 mm and 4 mm. It is particularly preferable that the Rogowski profile 26 of the test electrodes 4 is designed for an electrode gap of 2 mm and the electrode gap is adjusted to 2 mm at the same time.

Since, as is well known, electrodes conducting sharp voltage spikes lead to inhomogeneity in the electric field generated by these electrodes, it is advantageous when the test electrodes 4 have a surface structure whose roughness has been set by polishing with a polishing tool having a grain of not greater than 10 μm. In this way, the sharp points of the pitting in the electrodes 4 are kept to a definite small dimension, which is advantageous for preventing local field inhomogeneity and is therefore advantageous for the reproducibility of the tests.

In order to generate an electric field in the test volume 5, an electrical voltage is applied to the electrodes 4 by means of a high-voltage source 28 with an internal resistance 27. The applied voltage can be, for example, several tens of kV, particularly from about 10 kV to about 70 kV, depending on the insulating medium 1 to be tested. During the measurement process, the voltage is increased starting from an initial value, e.g., 10 kV, until breakdown occurs. The waveform of the voltage can be an ascending ramp, for example. Breakdown can be detected, for example, as a change in voltage with a voltmeter 29 measuring the voltage occurring at the electrodes 4. It is also conceivable and possible to detect breakdown with a current meter or a combination of current meter and voltmeter.

In the embodiment example according to FIGS. 8 and 9, in contrast to the embodiment example described above, the inlet pipe connection piece 15 and outlet pipe connection piece 16 proceeding from the inlet opening 8 and outlet opening 9 are both formed so as to be straight. In this case, the associated receiving vessel, not shown, must have separate openings for the pipe connection pieces 15, 16.

FIG. 10 shows an embodiment example of a testing arrangement according to the invention in which the insulating medium 1 flows through the test cell 2 during the measurement. The flow of the insulating medium 1 through the test cell 2 is maintained in this instance by a hydrostatic pressure difference between the sample vessel 13, which is elevated, and the end of the outlet line 12. The insulating medium 1 flows out of the sample vessel 13 through the inlet line 11 into the test cell 2 and from the latter through the outlet line 12 into a collecting vessel 31. A shutoff valve 32 by means of which the flow can be interrupted or released can be arranged in the outlet line 12.

The feed into the test cell 2 is preferably carried out from below in both the circulation method (FIG. 1) and the through-flow method (FIG. 10). Gas bubbles which can occur during breakdown and rise to the top can flow out of the outflow pipe connection piece located at the top along with the flow of insulating medium.

The testing arrangement could also be modified beyond the described embodiment example without departing from the framework of the invention. In particular, the receiving vessel 7 could have a shape deviating from the shape of the test cup specified in the relevant standards. For example, it could be made from a base body in the shape of a substantially cylindrical pipe with inlet and outlet openings or inlet and outlet lines even in a shape analogous to that of the test cell 2. This would be advantageous for automated replacement of the auxiliary insulating medium.

A measurement process could also be carried out without a flow through the test cell, particularly when a small sample amount of insulating medium is to be tested.

Further, for testing the insulating medium of a transformer, it is also conceivable and possible to introduce the test cell directly into the interior of the transformer having the insulating medium. Accordingly, this portion of the transformer makes up the receiving vessel 7, and the insulating medium to be tested serves as auxiliary insulating medium 6. In an embodiment form such as this, only openings, but not pipe connection pieces, are arranged at the test cell base body 19. For example, the test cell base body 19 is provided with a plurality of openings spaced apart around the circumference. A flow through the test cell 2 results by the thermal convection in the transformer.

It would also be conceivable and possible in other situations to use the insulating medium to be tested as auxiliary insulating medium 6 in the receiving vessel 7. The same medium would then be found inside and outside the test cell 2.

As follows from the preceding description, the field of the invention is not limited to the embodiment examples shown herein, but rather should be defined with reference to the appended claims together with their full range of possible equivalents. While the preceding description and drawings show the invention, it is obvious to a person skilled in the art that various modifications can be carried out without departing from the spirit of and field of the invention.

REFERENCE NUMBERS 1 insulating medium
2 test cell
3 interior space
4 test electrode
5 test volume
6 auxiliary insulating medium
7 receiving vessel
8 inlet opening
9 outlet opening
10 center plane
11 inlet line
12 outlet line
13 sample vessel
14 pump
15 inlet pipe connection piece
16 outlet pipe connection piece
17 side wall
18 side wall
19 test cell base body
20 receiving opening
21 receiving opening
22 sealing ring
23 annular groove
24 stop
25 counter-stop
26 Rogowski profile
27 internal resistance
28 high-voltage source
29 voltmeter
30 springing-elastic member
31 collecting vessel
32 shutoff valve

What is claimed is:

1. A testing arrangement for testing the dielectric strength of liquid insulating media comprising:
    a test cell having an interior space for receiving an insulating medium to be tested;
    said test cell having a first test electrode and a second test electrode for generating an electric field in a test volume of the test cell, said test cell having further a test cell base body with an inner wall surface delimiting the interior space of the test cell and with an outer wall surface, the test cell base body being made of an insulating material and having opposing first and second receiving openings through which the first and second electrodes penetrate; and
    said test cell being arranged in an interior space of a receiving vessel, the interior space of the receiving vessel in which the test cell is arrange being filled with an auxiliary insulating medium or being evacuated so that the outer wall surface of the test cell base body is subjected to the auxiliary insulating medium or to vacuum.

2. The testing arrangement according to claim 1;
wherein the test cell has at least one inlet opening for the inflow of the insulating medium to be tested and at least one outlet opening for the outflow of the insulating medium to be tested.

3. The testing arrangement according to claim 2;
wherein at least one inlet opening and at least one outlet opening are arranged opposite one another with respect to the test volume of the test cell and lie in the area of a center plane between the first electrode and second electrode.

4. The testing arrangement according to claim 2;
wherein at least one inlet opening and at least one outlet opening are connected to a sample vessel for the insulating medium to be tested by an inlet line and an outlet line, respectively, and the insulating medium to be tested can be circulated between the sample vessel and the test cell by a pump.

5. The testing arrangement according to claim 2;
wherein an inlet pipe connection piece and outlet pipe connection piece proceeding from the test cell adjoin the inlet opening and outlet opening, respectively, and project out through different openings of the receiving vessel.

6. The testing arrangement according to claim 2;
wherein an inlet pipe connection piece and outlet pipe connection piece proceeding from the test cell adjoin the inlet opening and outlet opening, respectively, at least one of which inlet pipe connection piece and outlet pipe connection piece is curved or bent, and the inlet pipe connection piece and outlet pipe connection piece project out through the same opening of the receiving vessel.

7. The testing arrangement according to claim 1;
wherein at least two oppositely located side walls of the test cell are formed at least for the most part by the first test electrode and second test electrode.

8. The testing arrangement according to claim 7;
wherein two oppositely located side walls of the test cell are formed in their entirety by the first test electrode and second test electrode.

9. The testing arrangement according to claim 1;
wherein the test cell has a test cell base body with receiving openings each for a test electrode.

10. The testing arrangement according to claim 8;
wherein the test cell base body is shaped as a cylindrical pipe piece and the receiving openings of the test cell base body are formed by the two open ends of the pipe piece.

11. The testing arrangement according to claim 9;
wherein at least one sealing ring is arranged for sealing between the receiving openings of the test cell base body and the test electrodes projecting through these receiving openings.

12. The testing arrangement according to claim 11;
wherein the at least one sealing ring is arranged in an annular groove of a test electrode, wherein the cross section of the annular groove is adapted to the cross section of the sealing ring.

13. The testing arrangement according to claim 9;
wherein the test electrodes have stops which contact counter-stops of the test cell base body for fixing the electrode gap.

14. The testing arrangement according to claim 13;
wherein the stops of the test electrodes are pressed against the counter-stops of the test cell base body by springing-elastic members.

15. The testing arrangement according to claim 1:
wherein the auxiliary insulating medium is oil or sulfur hexafluoride.

16. The testing arrangement according to claim 1;
wherein a substantially homogeneous electric field can be formed in the test volume by the test electrodes.

17. The testing arrangement according to claim 1;
wherein the electrode profile of the first test electrode and second test electrode is formed as a Rogowski profile.

18. The testing arrangement according to claim 1;
wherein the first test electrode and second test electrode are arranged in a mirror-symmetric manner, wherein they are preferably arranged with an electrode gap between 1 mm and 4 mm.

19. The testing arrangement according to claim 1;
wherein the auxiliary insulating medium is formed by the insulating medium to be tested.

20. The testing arrangement according to claim 19;
wherein the receiving vessel receiving the test cell is a part of a transformer, which part is filled with the insulating medium to be tested.

\* \* \* \* \*